United States Patent [19] … [11] 4,372,037
Scapple et al. … [45] Feb. 8, 1983

[54] LARGE AREA HYBRID MICROCIRCUIT ASSEMBLY

[75] Inventors: Robert Y. Scapple, Los Angeles; Frank Z. Keister, Culver City; Robert G. Grieger, Marina Del Rey; Richard P. Himmel, Mission Viejo, all of Calif.

[73] Assignee: Hughes Aircraft Company, Culver City, Calif.

[21] Appl. No.: 104,471

[22] Filed: Dec. 17, 1979

Related U.S. Application Data

[63] Continuation of Ser. No. 774,298, Mar. 4, 1977, abandoned, which is a continuation-in-part of Ser. No. 554,787, Mar. 3, 1975, abandoned.

[51] Int. Cl.$^3$ ............................................. H01C 17/02
[52] U.S. Cl. ..................................... 29/613; 29/832; 29/841; 174/52 FP; 361/400
[58] Field of Search ............. 361/400, 402; 174/52 S, 174/52 FP; 357/74, 75; 29/613, 829, 841, 831, 848, 832, 855, 840, 860

[56] References Cited

FOREIGN PATENT DOCUMENTS 2118752  2/1972  France .
1369627 10/1974  United Kingdom .

OTHER PUBLICATIONS

Gioia, "Multilayering for a Low Cost Hermetic Thick-Film Substrate Package," Solid State Technology, Jul. 28, 1972.

Primary Examiner—Leon Gilden
Attorney, Agent, or Firm—Lewis B. Sternfels; W. H. MacAllister; A. W. Karambelas

[57] ABSTRACT

A ceramic substrate includes a multiplicity of alternately screened and fired conductor and dielectric levels, with interconnections between levels through small via holes in the dielectric layers or alternately by means of crossovers. Thick film resistors are incorporated throughout the ceramic substrate, wherever needed, and the thick film resistors are printed and trimmed through windows which extend through any upper layers. In addition, resistors may be printed directly on top of the dielectric layers where necessary. Selective area hermetic sealing is utilized only for those chips and wire bonds which require environmental protection by placement of a ring frame seal encircling the selected area and over insulation on substrate conductors which are routed directly beneath the sealing area. A lid is directly soldered to the frame and, before final sealing, a proper environment is created within a sealed area. Where equivalent chip versions of electronic components are not available, discrete components are soldered directly to the ceramic substrate outside of the sealed area. Necessary thermal dissipation can be afforded by direct mounting of the multilevel substrate on a heat sink.

5 Claims, 7 Drawing Figures

LARGE AREA HYBRID MICROCIRCUIT ASSEMBLY

CROSS REFERENCE TO RELATED APPLICATION

This is a continuation of copending application Ser. No. 774,298 filed Mar. 4, 1977, in turn, a continuation-in-part of copending application Ser. No. 554,787 filed Mar. 3, 1975, both now abandoned.

BACKGROUND OF THE INVENTION

1. Field of the Invention

The present invention relates to means and method for providing large area hybrid electronic packaging on a single substrate.

2. Description of the Prior Art

Current hybrid technology generally consists of fabricating and assembling passive and active components in a single small enclosure which is usually made hermetic. Examples of such enclosures are ceramic and metal packages which are ¼" square or 1" square having 14 or 30 leads. Thick and thin film techniques are utilized for producing passive circuit elements on substrates mounted within these packages, and uncased discrete devices are used for semiconductors and other circuit elements. The hybrid microcircuit thus produced is typically the electronic equivalent of an assembled printed wire board. The hybrid is ultimately mounted onto a printed wiring board along with other hybrids and discrete components. Accordingly, the hybrid may be said to represent the first level of integration and the assembled printed wiring board as the second level of integration. In such hybrid technology utilizing assembled printed wiring boards, most thick film hybrid work is restricted to substrates smaller than two inches square with very few multilayer techniques extending beyond two or three conductor levels.

Examples of some prior art techniques are described in the following publications: "Low Cost Packaging of Thick-Film Substrates With Ceramic Glass Seals" by J. C. Gioia, NEPCON PROCEEDINGS, 1970, Pages 10-42 to 10-46; "Aspects of Multilayered Thick-Film Hybrids" by R. G. Loasby, Solid State Technology, May 1971, Pages 33-37, 46; "Evaluation Testing of a Thick Film Multilayer Interconnect System" by M. W. Rossman, INTERNATIONAL HYBRID MICROELECTRONICS SYMPOSIUM, 1970, pages 6.3.1-6.3.9; "Fabrication of Multilayer Thick Film Microelectronic Circuits" by L. K. Keys, A. J. Russo, F. J. Francis and S. Herring, Jr. in INTERNATIONAL HYBRID MICROELECTRONIC SYMPOSIUM, 1970, Pages 6.4.1-6.4.10; and "Development of Large Thick-Film Multilayer Assemblies" by H. R. Isaak, J. W. Kanz and E. G. Babiracki in 1971 INTERNATIONAL MICROELECTRONICS SYMPOSIUM, Oct. 11-13, 1971, pages 1-27. Selected U.S. patents describing the prior art include U.S. Pat. Nos. 3,264,402; 3,302,067; 3,546,776; 3,581,375; 3,646,399; 3,674,914; and 3,691,628.

Prior art hermetically sealed packages fail to meet the requirements of a large area hybrid from several aspects. Four specific examples of these are discussed below. U.S. Pat. No. 3,609,294 speaks of thin film sputtering and etching, rather than thick film screened and fired circuits. It does not have a selective area hermetic seal nor is the disclosed device a large area structure. U.S. Pat. No. 3,602,634 speaks of a simple small semiconductor package, not a hybrid microcircuit with selective area seals. The cover is sealed by brazing rather than soldering. The insulating layers are of glass with deposited thin film aluminum conductors rather than a thick ceramic dielectric layer with thick film gold or platinum-gold screened and fired conductors. U.S. Pat. No. 3,753,054 discusses a large hermetic package designed to accommodate an LSI wafer, not a hybrid microcircuit. Hermeticity is obtained by brazing and welding rather than soldering and thus is not repairable. U.S. Pat. No. 3,673,309 discusses a single chip enclosure, rather than a hybrid microcircuit. The cover is brazed (not soft soldered) directly to the substrate rather than to an intermediate ring frame. In addition, it seals to a gold paste, which experiences leaching and scavenging problems, rather than to a platinum-gold alloy paste.

In general, the majority of prior art suffer from one basic respect. They are generally applicable only for *small* packages (usually less than one-inch on a side), and not to large structures—as large as 6-inches on a side. Processes and materials which work on small structures cannot simply be applied when the structure is expanded in area. In part, the largest problem to overcome is one of finding the proper combination of materials and processes which would work on large area structures while still maintaining the necessary reliability and yield.

The above-described prior art further suffers from one or more problems. The conventional printed wiring board design precludes the most effective use of board area and height required by the attachment of hybrid packages and other electronic components to the printed wiring board either directly or by wire bonds. Such a layout further results in extra weight which, for airborne and other uses, may result in a severe penalty in terms of space and added fuel consumption. The need to mechanically and electrically couple all individual components to the printed wiring board results in a large number of interconnections with increased possibility for resulting open and short circuits. In addition, because of the requirement to make a large number of interconnections, the complexity of each printed wiring board is limited. As a further problem, many components must be thermally coupled to a heat sink because of their high power loads. In general, conventional hybrid packages are mounted on a thermal supporting structure which, in turn, must be thermally coupled to a thermal dissipation means, that is, a heat sink. Because of the number of interfaces due primarily to the various adhesives used for bonding purposes in microcircuit fabrication, high thermal impedance occurs with the result that the requirement to cool the printed wiring board electronic system presents a limitation as to how much power can be achieved with each system.

Repair of such printed wiring board systems is relatively complicated. For example, if an individual hybrid package exhibits some fault, the package leads must be unsoldered and the package removed from the printed wiring board for replacement or repair. In the event of repair, the conventional package lid must be removed by heat applied to the sealing areas. Such heat may deleteriously affect otherwise functioning components within the hybrid package, thereby leading to further waste of material and components, in addition to loss and excessive use of manpower.

SUMMARY OF THE INVENTION

The present invention overcomes and avoids these and other problems by directly replacing the conventional assembled printed wiring board with a heat conductive base, such as of ceramic, on or within which is directly placed all components. Where, for example, the prior art wiring board has several hybrid packages mounted thereon, the present invention hybridizes nearly the entire base or substrate, including all discrete components wherever possible. All connections are made by hybrid technology, and selected area hermetic sealing of sensitive devices is provided directly on the substrate. The substrate includes several layers of electrical circuitry within and across its surface, and further includes thin and thick film resistors. Wherever possible, microelectronic chips are bonded directly to the substrate and to the multilayered circuitry, and only those chips and wire bonds requiring environmental protection are sealed, by a single enclosure with sides or preferably by means of a ring frame seal secured to the substrate over insulation with a cover or lid secured to the ring frame. Thus, if repair is required, only the cover need be removed and any heat produced thereby is sufficiently displaced from the chips by a distance greater than if removal were made at the substrate level.

While printed wiring board designs commonly include a large number of discrete components, wherever possible the present invention utilizes equivalent chip versions of these components. However, if no equivalent exists, the discrete components can be soldered directly to the substrate.

In order to provide the necessary thermal dissipation, the present invention envisions a direct mounting of the substrate to a heat sink structure, whether comprising a cold plate or a honeycomb structure, such as is disclosed in copending application Ser. No. 554,789, entitled, "Thermally Controlled Electronic System Package" by Wesley E. Bartholomew, now U.S. Pat. No. 4,006,388, issued Feb. 1, 1977. By use of such direct thermal mounting on a heat sink, a pair of substrates with components mounted thereon, in accordance with the teachings of the present invention, may be mounted on one or both sides of the heat sink for economy of space and electronic design.

It is, therefore, an object of the present invention to provide for an alternate approach to the conventional printed wiring board circuit design.

Another object is to provide for efficiency and savings in area over conventional techniques.

Another object is to provide for a decrease in weight per electrical function requirement.

Another object is to provide for fewer interconnections of components.

Another object is to provide for the ability to obtain more complex electrical functions than the printed wiring board counterpart (i.e., a higher packaging density).

Another object is to provide for greater flexibility in design and partitioning of the electrical components and circuitry on a substrate.

Another object is to provide for decreased costs in testing and trouble-shooting.

Another object is to provide for improved electrical performance by shortened conductor paths and by mounting components more closely together on the substrate.

Another object is to provide for improved reliability in view of the reduced number of interconnections, smaller size for a given electrical function, commonality of materials, and more uniform thermal environment.

Other aims and objects as well as a more complete understanding of the present invention will appear from the following explanation of exemplary embodiments and the accompanying drawings thereof.

DESCRIPTION OF THE PREFERRED EMBODIMENTS

Figure 1:
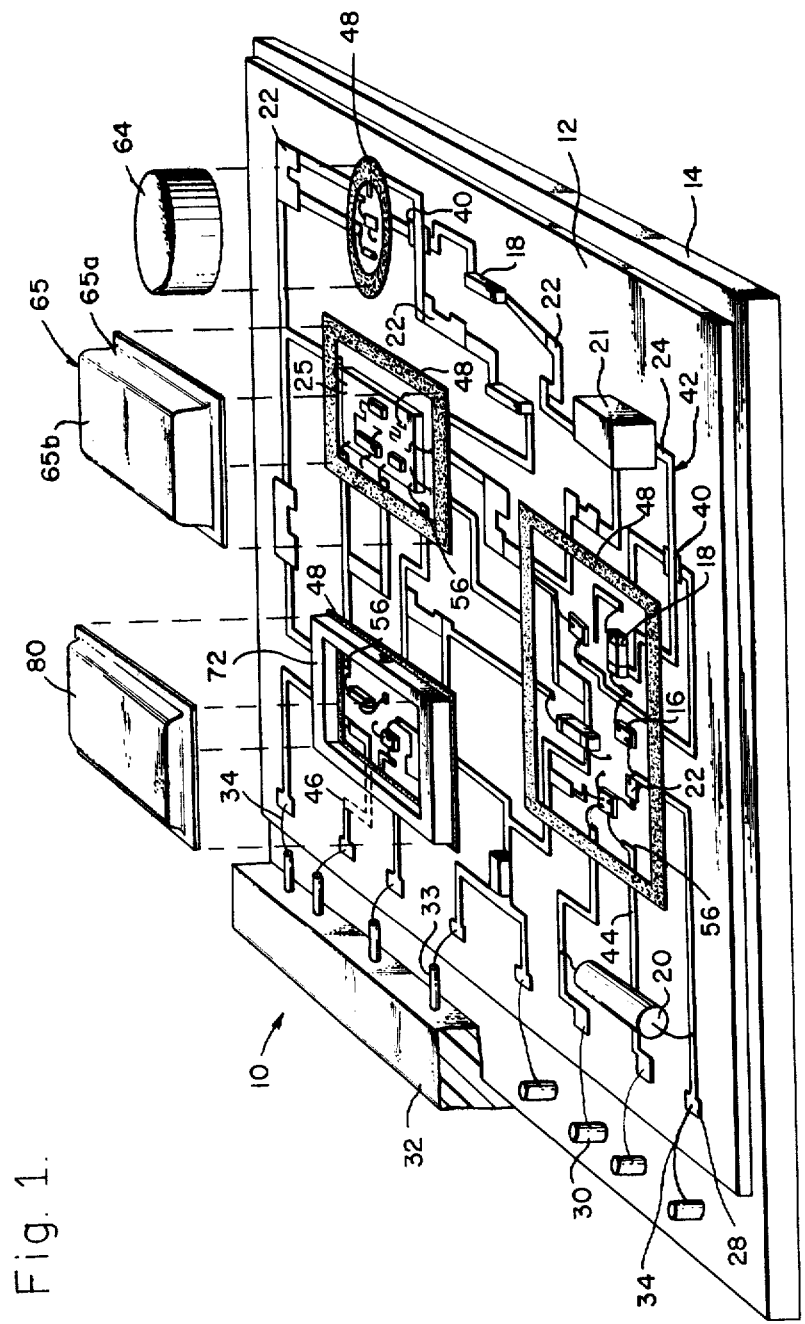
FIG. 1 schematically depicts, in partial cross-section and in partial explosion, the various concepts of the present invention.

Referring to FIG. 1, a large area hybrid microcircuit 10 comprises a large area substrate 12 bonded, such as by brazing or by any other suitable means, to a mounting plate 14. On substrate 12 are a plurality of components such as semiconductor chips 16, capacitor chips 18, discrete components 20 and 21, such as special type resistors or capacitors, thick film resistors 22, multilayer thick film conductors 24, and environmentally protected components comprising any of the above as well as thin film substrates 25, residing within hermetic sealing areas 48. Sealing may be effected by an enclosure lid 64 directly bonded to sealing areas 48 or by a two part ring frame and cover described in greater detail with respect to FIGS. 2a-2f.

The various components, generally identified by indicia 16-25, are all electrically interconnected by appropriate circuitry 42 and extend to thick film solder pads 28, which are electrically coupled to terminals 30 or to a pin or socket connector 32 by means of jumper wires 34 or other appropriate connections for electrically coupling large area hybrid microcircuit 10 into some larger electrical function.

As shown, mounting plate 14 comprises a solid block of material which may be of metal (such as aluminum or copper) or epoxy-glass laminate. The mounting plate serves both as a structural support and as a heat sink. If the substrate is thick enough (i.e., greater than 0.040-inch) and if the power requirements are low enough, no mounting plate is needed. Mounting plate 14 may take the form of a heat sink configured as a cooling plate or cooling fins of corrugated thin stock, such as more fully described in above-noted U.S. Pat. No. 4,006,388, entitled, "Thermally Controlled Electronic System Package," by Wesley E. Bartholomew. Regardless of the particular cooling method, the present invention is compatible with both forced-air and conduction cooling techniques. In the forced-air cooled version, the preferable construction provides direct bonding of substrate 12 to the thin stock, such as described in U.S. Pat. No. 4,006,388. In the conduction cooled version, there are two variations comprising conduction through the large hybrid ceramic substrate, and enhanced conduction by means of an attached metal heat sink.

Studies show that the forced-air cooled version produces a very low thermal impedance, which is far lower than a printed wiring board with a copper heat sink, thereby making this version suitable for high power applications. The conduction cooled version with aluminium heat sink is also comparable to or better than the printed wiring board with a copper heat sink. Without a heat sink, the conduction version has a relatively high thermal impedance and should be used only for low power applications. When connected to a heat sink, the present invention has an inherent thermal advantage compared to conventional hybrids mounted on a thermal supporting structure, due primarily to the fewer high impedance interfaces between the heat source and the point of heat rejection. High impedance interfaces are due primarily to the various adhesives used in microcircuit fabrication.

The particular construction of substrate 12, with its multilayer wiring and the components thereon as well as the method for preparing the same, may be appreciated with respect to FIG. 1, with a specific further fabrication technique and description of the structure later given with respect to FIGS. 2a-2f. As shown, a structural support, such as mounting plate 14, is prepared with a plurality of connector receiving points 28 thereon. As stated before, support 14 may be of any convenient material, such as of metal or a glass-base epoxy laminate. If, however, the support comprises cooling fins, connector receiving points are preferably mounted directly on substrate 12.

Basic thick film substrate 12, preferably made of a ceramic material such as 96% alumina, is prepared for processing thereof into a completed microcircuit. The surface of the substrate is first cleaned and then multilevel resistor, insulating or dielectric, and conductor patterns are screened and fired thereon. Firing of the conductors and resistors is normally done in air at temperatures ranging from 800° C. to 1,000° C. using a conveyor furnace. The insulating or dielectric patterns may be fired from 500° C. to 1,000° C. depending upon the material selected. These patterns may be provided in any suitable manner such as by multilayering, crossover, or a combination thereof, along with multiple selective seal areas and thick film printing. In the multilayer technique, conductive and dielectric patterns are alternately screened on the substrate during its production utilizing via holes therein so as to build up the conductor pattern within the substrate to a plurality of levels. The via holes in the dielectric layers are used to electrically interconnect the adjacent conductor layers. In the crossover design, dielectric solder dams are used to prevent solder from touching the conductors and dielectric crossover paths, such as path 40, are placed on conductors over which upper level conductors are to extend, in the manner disclosed in copending patent application, Ser. No. 403,709, filed Oct. 4, 1973, now abandoned, entitled "Thick and Thin Multilayer and Crossover Process for Hybrid Microcircuits and Devices Made Thereby" by Frank Z. Keister and Robert Y. Scapple, two of the inventors herein.

This processing forms a circuit pattern, generally indicated by indicium 42, comprising top level thick film conductors 44 and submerged or lower level thick film conductors 46. Thereafter, all resistors are trimmed as required. Included within this screening and firing process is a preparation of selected seal areas 48 designed for hermetic sealing of components therein.

Although the complete fabrication of the selective area hermetic seals will be described in greater detail hereinafter, in brief, a metal ring frame 72 is secured to area 48, such as by soldering, followed by a leak test to determine the hermeticity of the seal.

Thereafter, all conductor paths which are eventually used for soldering are pretinned. Substrate 12 is then adhesive-bonded to structural support 14, such as by a silicon or epoxy adhesive, or brazed to a cooling fin. Discrete components 20 and 21, which do not have a chip size equivalent, are then soldered to substrate 12, with the discrete components being adhered in place by means of an epoxy or polysulfane resin prior to soldering. All strap wires are then soldered to the substrate and from solder pads 28 to connection points, such as terminals 30, on support 14 or directly to pins 33 of a connector, such as connector 32.

Chip components 16 (such as transistor chips, diode chips, or capacitor chips) are then mounted within ring frame 72 and wire bonded to the terminal bonding points 56 which extend from circuit pattern 42 outside of selected sealing areas 48 to within the selected sealing areas.

A connector 32 is then adhesive-bonded or otherwise mounted and soldered to structural support 14 with leads 34 therefrom bonded to thick film solder paths 28 on substrate 12. Certain designs of large area hybrids do not necessarily use connectors. Other means such as contour cables are then used to electrically couple substrate 12 to the next higher circuit function. An epoxy adhesive is then placed over all the soldered joints, if required, and presealing electrical tests are conducted. Any trimming of thick film resistors may be made by laser trimming methods, followed by any rework as may be necessary. Thereafter, a cover, such as covers 64 and 65, in which cover 65 comprises integral flanged sides 65a and top 65b and cover 64 is without flanges, or as described with respect to FIGS. 2a-2f, is soldered to ring frame 72 in a dry box and in a nitrogen atmosphere. FIG. 1 shows covers 64 and 65 being soldered directly to the seal areas 48 and 25 on the substrate, whereas cover 80 is soldered to ring frame 72. Both solder seals are applicable, however, the ring frame is utilized where repair is contemplated should the hybrid malfunction. Both fine and gross leak tests for hermeticity are conducted followed by acceptance testing. For added protection and confidence, the entire large area hybrid microcircuit may be then conformally coated with a polyurethane plastic.

Figure 2A:
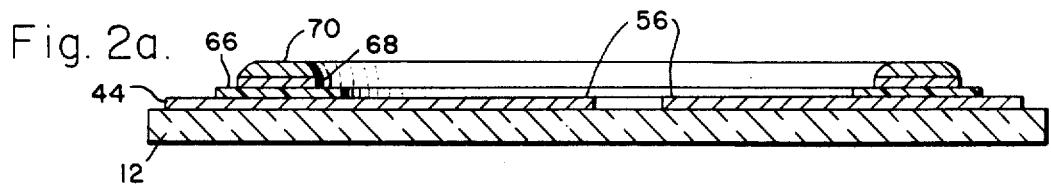
FIGS. 2a-2f depict the various steps, in elevational cross-section, of the techniques for forming the selective area seals depicted in FIG. 1.
Figure 2B:
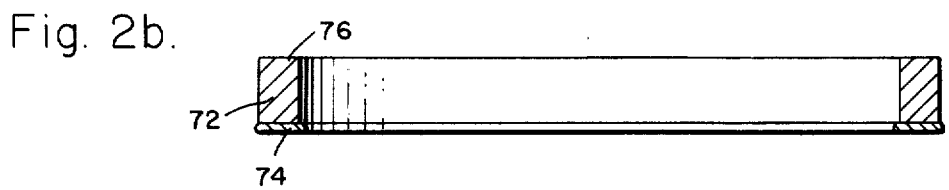
Figure 2C:
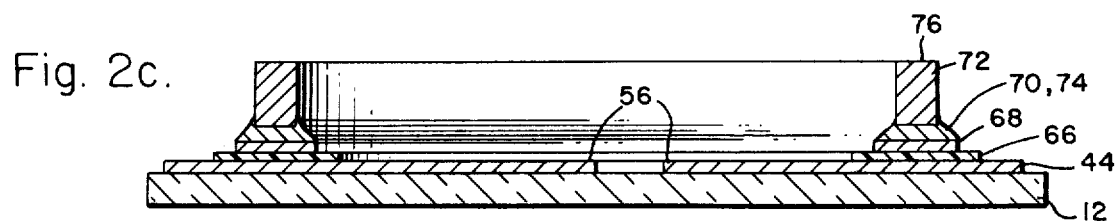
Figure 2D:
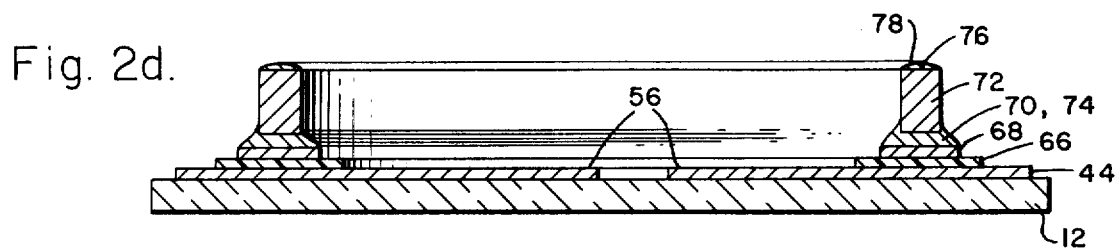

Referring now to FIGS. 2a-2f, the structure and steps for making the selective area hermetic seals for sealing areas 48 will be described. Starting with the thick film screened and fired sealed area 48, such as depicted in FIGS. 1 and 2a, the seal area is covered with a dielectric closed loop 66 for insulating any leads 44 of the underlying circuit pattern 42. The dielectric material is a glass-ceramic paste which is screened on and subsequently fired at temperatures ranging from 500° C. to 1,000° C. depending upon the material. Two dielectric screenings are normally used in order to build up a sufficient thickness to preclude pinholes. Dielectric 66 prevents electric shorting of metal loop 68 and ring frame 72 to underlying conductor 42. The underlying pattern 42 is usually of a conductive thick film paste, such as gold or platinum-gold which is wire-bondable.

Figure 2E:
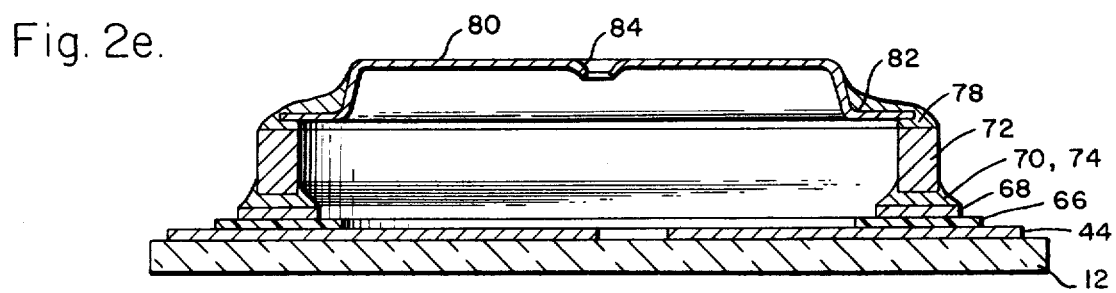
Figure 2F:
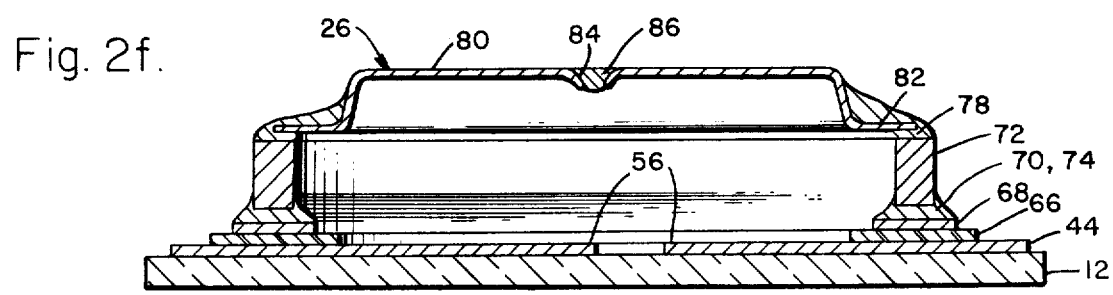

Over dielectric closed loop 66 is placed a metal closed loop 68, such as a thick film paste of a platinum-gold alloy, or a platinum-silver alloy. The metal loop 68 is screened and fired at temperatures from 800° C.-1,000° C. The metal loop must be of a material which is solderable, non-leaching, and non-scavenging and must be compatible with the dielectric over which it is screened. Thereafter, metal closed loop or sealing area 68 is then tinned with an appropriate solder 70. The solder used must be ductile enough to prevent any future fracture or leakage of the hermetic seal, it must wet but not scavenge or leach the thick film paste beneath it, and it must be strong enough to withstand the rigors and stresses of repeated temperature cycling, thermal shock, and high temperature storage at temperatures up to +150° C. Tests have shown that Sn10 solder (10% tin, 90% lead) is satisfactory and that other solders, such as Sn96, Sn63, and Sn60 are not. A ring frame 72, preferably of nickel-gold plated KOVAR (an iron-nickel-cobalt alloy), having an Sn10 pretinned surface 74 is sealed to tinned area 70, such as by solder reflow techniques, see FIGS. 2b and 2c. Thereafter (FIG. 2d), an upper surface 76 of ring frame 72 is tinned with a solder 78. The solder 78 must match the solder which will eventually be used to seal the cover to the ring frame. A solder alloy known as Sn96 (96% tin, 4% silver) is suitable. As shown in FIG. 2e, a cover 80, preferably also of KOVAR which has been nickel plated and tin plated, although cold rolled steel may be used, and preferably having a flange 82 at its periphery, which is tinned, is then solder sealed to ring frame 72 at its tinned upper surface 76. The sealing solder 78 is an Sn96 alloy. This solder must form a hermetic seal, must withstand thermal and mechanical shock, and repeated temperature cycles from −65° C. to +150° C., must wet and form a smooth solder fillet with the cover and ring frame, and should have a melting point lower than that of the solder used to join the ring frame to the substrate. Sn96 solder melts at 221° C. which is 78° C. lower than the liquidus point of Sn10 solder (299° C.). Sealing solder 78 must also permit removal and replacement of KOVAR cover 80 without degrading ring frame 72. Sealing of the cover 80 to the ring frame 72 is done in a dry box (preferably at a dew point of −55° C.) in a nitrogen atmosphere without the use of flux. Hermetic sealing of the enclosure may be provided by a hole 84 in cover 80 which is thereafter closed with solder 86, as seen in FIG. 2f; however, hole 84 may be dispensed with if proper sealing is otherwise obtained. Leak tests are made preferably at each step in the process.

Although cover 80 may be solder sealed directly to substrate 12 without the need for ring frame 72, it is preferred to use the ring frame in order to enhance repairability. For repair, only the cover need be removed with maximum protection against accidental damage to any of the components contained within the sealing area. Furthermore, if it is desired, cover 80 need not be flanged but may comprise a flat cover or one having simply turned-down edges; however, it has been found most practical to utilize a flanged cover. In addition, a raised cover (as opposed to a flat cover) provides added height clearance within the sealed area which may be required for some large components and wire bond loops.

A unique feature of the hermetic seals (FIGS. 2a-2f) is that they can be made at preselected areas on a larger substrate. Such seals may be of a variety of sizes, such as 0.6-inch in diameter, 1×1 inch, or 1×2-inch. Another unique feature of these seals is that thick film conductors may be routed beneath the perimeters of the sealed areas as a means of getting electrical signals into and out of the hermetic area. Still another unique feature of these seals is that they are repairable and may be of a large size. Seals as large as 3-inch diameter have been made using the materials and processes described in this invention.

Although the invention has been described with reference to particular embodiments thereof, it should be realized that various changes and modifications may be made therein without departing from spirit and scope of the invention.

What is claimed is:

1. A method for fabricating a large area hybrid microcircuit assembly comprising the steps of:
   placing thick film multilevel conductor, resistor and dielectric patterns on a substrate, including at least one selected area for later placing of electronic components to be hermetically sealed therein;
   trimming all of the resistors in the patterns;
   placing at least one closed loop of thick film dielectric material around the selected area, and over all input, output and ground leads extending from the patterns and terminating within the selected area;
   placing a closed loop of thick film sealing metal over each dielectric material closed loop in which the sealing metal consists of a solderable composition which is compatible with the dielectric material;
   securing a closed ring frame to each sealing metal closed loop by a first solder consisting of a composition which is sufficiently ductile for militating against fracture and leakage thereof;
   electrically and mechanically securing any discrete electrical components to the patterns and the substrate outside of the selected area;
   mounting the electronic components to the substrate within the selected area and the closed ring frame, and electrically coupling the components to the input, output and ground leads therein;
   sealing a cover to each closed ring by a second solder consisting of a composition which is capable of forming a hermetic seal and withstanding thermal and mechanical shock and repeated temperature cycles such as from −65° to 150° C., and which has a melting point lower than the first solder, and providing a non-reactive environment within the sealed selected area for safeguarding the electronic components from otherwise degrading environment; and
   electrically and environmentally testing the assembly.

2. A method as in claim 1 further comprising the steps of removing the cover from the closed ring frame for effecting repairs without thermally damaging the electronic components as a result of the second solder composition.

3. A method as in claim 1 wherein said multilevel resistor and conductor placing step comprises the steps of screening and firing the patterns on the substrate.

4. A method as in claim 1 wherein said closed ring frame securing step and said cover sealing step comprises soldering steps in which the sealing metal closed loop comprises one of a thick film platinum-silver alloy paste, or a platinum-gold alloy, and tinned with Sn10 solder alloy, in which the closed ring frame comprises one of metallized alumina ceramic, an iron-nickel-cobalt alloy, or a cold rolled steel alloy, and in which the cover comprises one of an iron-nickel-cobalt alloy electroplated with gold-over-nickel or electroplated with tin-over-nickel and subsequently fused.

5. A method as in claim 1 wherein said steps of providing a non-reactive environment comprises the step of soldering the cover to the closed ring frame in a dry box in a nitrogen atmosphere.

* * * * *